United States Patent [19]

Douglass

[11] Patent Number: 5,786,979
[45] Date of Patent: Jul. 28, 1998

[54] HIGH DENSITY INTER-CHIP CONNECTIONS BY ELECTROMAGNETIC COUPLING

[76] Inventor: Barry G. Douglass, 1930 W. Rundberg La. Apt. 1236, Austin, Tex. 78758

[21] Appl. No.: 574,056

[22] Filed: Dec. 18, 1995

[51] Int. Cl.⁶ ........................................ H01G 4/38
[52] U.S. Cl. ................. 361/328; 257/777; 361/803
[58] Field of Search .................. 361/311–313, 328–330, 361/763, 734, 766, 782, 811, 821, 803; 257/777; 29/25.41, 25.42

[56] References Cited

U.S. PATENT DOCUMENTS

| | | | |
|---|---|---|---|
| 4,342,143 | 8/1982 | Jennings | 29/25.42 |
| 5,384,434 | 1/1995 | Mandai et al. | 174/258 |
| 5,590,016 | 12/1996 | Fujishiro et al. | 361/313 |

OTHER PUBLICATIONS

Landers, et al.; "Electronics Manufacturing Processes"; 1994 by Prentice–Hall, Inc.; p. 105; United States; Englewood Cliffs, NJ 07632.

*Primary Examiner*—Bot L. Ledynh
*Attorney, Agent, or Firm*—David H. Carroll

[57] ABSTRACT

Signal communication paths between multiple chips are established through inter-chip electro-magnetic coupling, thereby potentially eliminating mechanical inter-chip contacts and increasing inter-chip interconnection capacity while maximizing chip real estate allocated to a circuit layer. In one embodiment, multiple chips each include a conductive layer, disposed over a circuit layer on a substrate, divided into electro-magnetic coupling device elements such as capacitor plates. When utilizing capacitor plates, chips are arranged face-to-face with opposing chips having mirror image capacitor plate patterns to form a plurality of capacitors. Conventional signal transmission circuits produce time-varying signals which propagate to conventional signal receiving circuits of another chip via an embodiment of electro-magnetic signal communication paths formed by the capacitors. In another embodiment, one of the chips may function as a passive chip carrier that includes a conventional communication path between sets of capacitor plates that capacitively interconnect multiple chips that are facially opposed to the chip carrier. In another embodiment, chips having a capacitive interconnect layer can be combined into arrays with each array arranged in an offset, face-to-face spatial orientation with respect to at least one other array. Because the arrays are offset, one chip may be capacitively coupled to more than one other chip. As a result, any chip may communicate with any other chip by propagating a transmitted signal from chip to chip via capacitor links until received by a destination chip.

37 Claims, 4 Drawing Sheets

HIGH DENSITY INTER-CHIP CONNECTIONS BY ELECTROMAGNETIC COUPLING

BACKGROUND OF THE INVENTION

1. Field of the Invention

This invention relates to electronic chip-to-chip interconnections useful for densely packing chip dice. In particular this invention relates to chips, for example, on a chip carrier or in a single package, electrically linked together by electro-magnetic coupling devices such as a new capacitive coupling interconnection structure.

2. Description of Related Art

Chip dice are often electronically interconnected on a single chip carrier, for example, on a single printed circuit board ("PCB") or in a single package such as a multichip module. In a multichip module, unpacked electronic chip dice are placed in a common package and normally linked together by chip interconnection wires. Because of the physical proximity of the chips to each other, the inter-chip wires can be made much smaller than normal wires at the PCB level. Smaller wires usefully increase the possibility of more inter-chip wire contacts per chip, as well as possibly increasing available chip area formerly occupied by wires. Such techniques have been proposed as a stepping stone towards the goal of wafer scale integration which would result in the highest possible speed and smallest size circuits. However, wafer scale integration has been infeasible due to low yield of large single chip surfaces. In the interim, small inter-chip wires continue to provide a popular approach to chip-to-chip connections to increase performance and chip density.

Nevertheless, even these small off-chip wire links require a relatively large amount of PCB area. Furthermore the relatively large size area occupied by the inter-chip wires and the size of the inter-chip wires themselves have dictated the use of special high current driving circuits to actuate signals transmitted through such wires. As a result, other techniques are being investigated, such as optical interconnections, which can be placed anywhere on the chip surface. However, current technology does not allow mixing on the same chip surface of silicon hardware and optical transmitters, which can only be made efficiently in Gallium Arsenide and other non-standard semiconductor media. Therefore, it is still necessary to connect chips electrically, by creating wire connections between chips, even if the wire only connects one chip to a neighboring chip.

Additionally, chip-to-wire connections require a mechanical bond which in turn necessitates providing a bonding pad. A bonding pad occupies significant chip space which might otherwise be allocated to increased chip density. Bonding pad sizes are in part dependent on the ability to provide adequate solder connection areas. Existing methods of providing mechanical bonds include soldered wire connections which, although normally used to connect chips to package leads, may be used to directly connect multiple chips within a single chip carrier. The existing mechanical bond providing methods also include special spring-loaded mechanical "fingers" which contact pads around the chip edge.

Up to one-thousand connections per 1 cm² chip can be achieved using "solder bumps", spaced around the chip face, to connect a face down mounted chip to another silicon surface, in what is called a "flip-chip" configuration. FIG. 1 illustrates placing solder bumps 102 around the face surface of a circuit chip 104. The solder bumps 102 are basically small solder protrusions placed on top of input/output pads 202 (FIG. 2) on the chip 104 face surface. For each solder bump 102, substrate 106 has a corresponding pad or bonding land 108 on its surface. When the chip 104 and substrate 106 are brought together as indicated and mated with the chip 104 flipped face down so that the solder bumps 102 contact corresponding bonding lands 108, electrical contact is achieved by reflowing the solder bumps 102. A multi-chip carrying structure similar to multi-chip carrier 200 as shown in FIG. 2 results.

This technique is known in the art as flip-chip joining or controlled collapse bonding and is described in more detail in Landers et al., *Electronic Manufacturing Processes*, Prentice Hall, p. 105, 1994. In each such flip-chip joining, the bonding land 202 must occupy a separate area of the chip 104 from the chip circuitry, and the size of the bonding lands 202 is dictated by the tolerance for placing each solder bump 102 or mechanical fingers (not shown) in the correct position. The area occupied on the chip 104 by the Input/Output pads 202 and by Input/Output driving circuitry (not shown) can be large compared to on-chip devices and connections, though potentially much smaller than those used in standard single chip carriers. Multi-chip carrier 200 further includes wires 204 to electrically interconnect other chips (not shown) mounted on substrate 106 to chip 104.

SUMMARY OF THE INVENTION

The invention increases the number of possible connections between chips and/or minimizes the amount of chip real estate allocated to physical inter-chip connections while making designing and manufacturing chips incorporating chip-to-chip interconnections much easier. The methods and structures described herein potentially provide higher inter-chip interconnection densities than existing methods and structures through the utilization of inter-chip electro-magnetic coupling. Interconnect structures in accordance with at least one embodiment of the invention occupy less chip circuit layer area, thereby allowing allocation of more chip circuit layer area to chip circuitry. Additionally, the interconnect structures may advantageously compete for a relatively small amount of chip real estate as compared to conventional technology. Furthermore, the inter-chip interconnections generally require only proximity chip-to-chip retention and do not require numerous mechanical wire bonding operations, thereby simplifying manufacturing processes. Moreover, the present invention allows inter-chip interconnections between chips of disparate materials.

The present invention avoids the difficulties of making metallurgical wire contact between two disparate chips and provides electrical chip-to-chip interconnections using electro-magnetic coupling. In one embodiment, chips include electro-magnetic coupling devices coupled to a circuit(s), such as an integrated circuit, disposed on a chip substrate. The electro-magnetic coupling devices include capacitor plates of any suitable size and geometric configuration and include inductors of any suitable size and geometric configuration. Electro-magnetic coupling devices of one chip are positioned with respect to corresponding electro-magnetic coupling devices of another chip to provide signal coupling through respective electro-magnetic fields. Each of the electro-magnetic coupling devices may be configured and positioned in accordance with various considerations. Such considerations may include consideration of signal strength and frequency, cross-talk between coupling devices and circuits, parasitic capacitances between coupling devices and circuit layer conductors, as well as the physical location of the signal transmitter and receiver circuits.

Furthermore, multiple chips may incorporate electro-magnetic coupling devices to provide multi-inter-chip communication paths. For example, multiple chips may be disposed in opposing tiled arrays with each chip electro-magnetically coupled to at least one opposing chip. By transferring signals from one opposing chip to another, all chips may communicate with each other with signals propagated through communication paths that include inter-chip electro-magnetic interconnections. Some of the chips in the tiled array may span the entire array to minimize the number of chip-to-chip communication path chip segments.

In another embodiment, multiple chips include electro-magnetic coupling devices coupled to a corresponding group of electro-magnetic coupling devices consolidated on a single communication chip. The communication chip may utilize conventional interconnection techniques to couple each group of its electro-magnetic coupling devices.

In another embodiment the present invention is an assembly including a first chip having a substrate and a circuit disposed on a face of the substrate. The first chip further includes a first means for coupling disposed over the substrate face and coupled to the underlying circuit. The assembly also includes a second chip, disposed in a face-to-face spatial relationship to the first chip. The second chip also includes a substrate and a circuit disposed on a face of the substrate and a second means for coupling disposed over the substrate face and coupled to the underlying circuit, wherein the first and second means for coupling provide at least one electro-magnetic path between the first and second chips for time-varying signals. In another embodiment, the first and second means for coupling each comprise respective pluralities of conductors disposed in opposition to form a plurality of capacitors.

Another aspect of the invention includes a method of multi-chip interconnection utilizing electro-magnetic communication paths. In one embodiment the present invention is a method of interconnecting a plurality of chips utilizing electro-magnetic signal communication paths, each chip having a circuit layer disposed on a face of a substrate and an electro-magnetic coupling device element coupled to and disposed over the underlying circuit layer, and each chip being oriented with respect to at least one other chip to form an electro-magnetic signal communication path between the electro-magnetic coupling device elements of the oriented chips, the method comprising the steps of generating a time-varying signal in a circuit of a first chip of the plurality of chips and coupling the time-varying signal to a circuit of a second chip, oriented with the first chip, through the electro-magnetic signal communication path between the electro-magnetic coupling device elements of the first and second chips.

BRIEF DESCRIPTION OF THE DRAWINGS

In the drawings, like features have the same reference character.

FIG. 6 also shows the positioning of the two surfaces once they are joined together facing each other.

DESCRIPTION OF THE PREFERRED EMBODIMENT

The following description of the invention is intended to be illustrative only and not limiting.

A completely different approach to electrically connecting multiple, separate chips is described. Chips are placed in close physical proximity to each other and coupled with one or more electro-magnetic fields. An electro-magnetic field is defined herein as a time-varying field, associated with electric or magnetic forces. For example, the chips may be capacitively, inductively, or capacitively and inductively coupled to provide inter-chip communication. Capacitive coupling effects are well known but are normally considered a nuisance, for example, between two flat conducting surfaces, such as on-chip wires, when placed close to each other.

Figure 1:
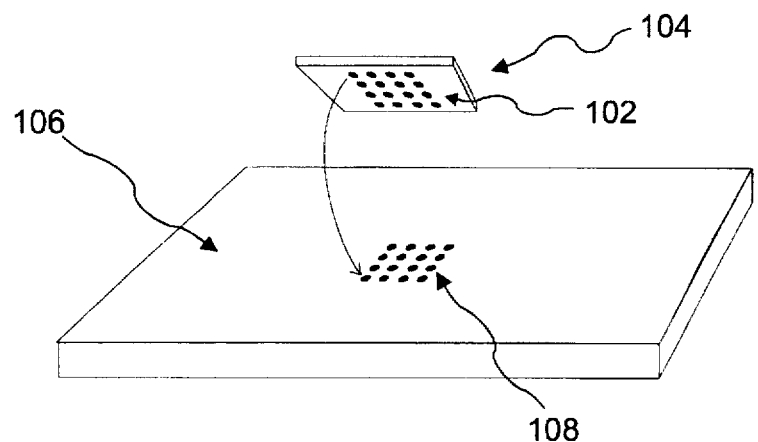
FIG. 1 is an exploded view of solder bumps and bonding land arrangements on a "flip-chip" multichip carrier.
Figure 2:
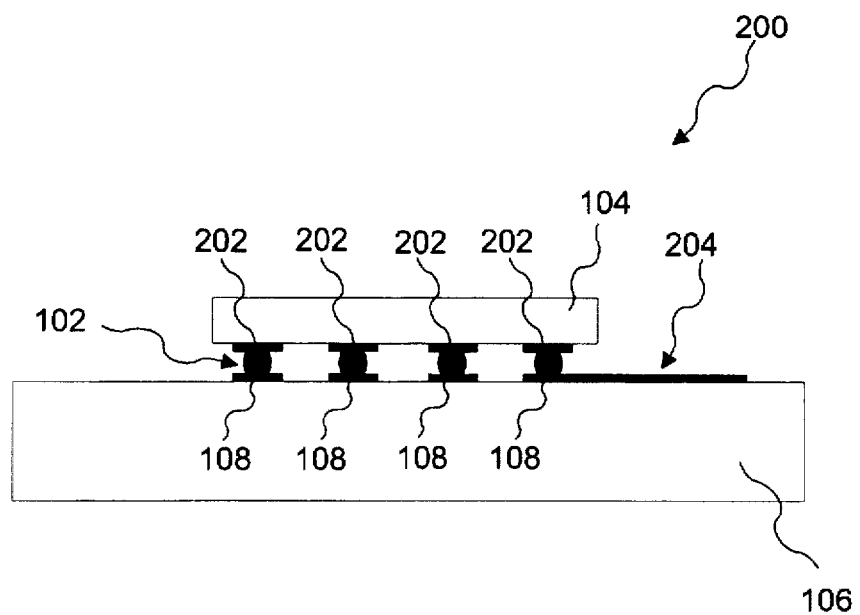
FIG. 2 is a side view of the resulting contact configuration once the chip and substrate of FIG. 1 are brought together in a "flip-chip" solder bump contact configuration.
Figure 3:
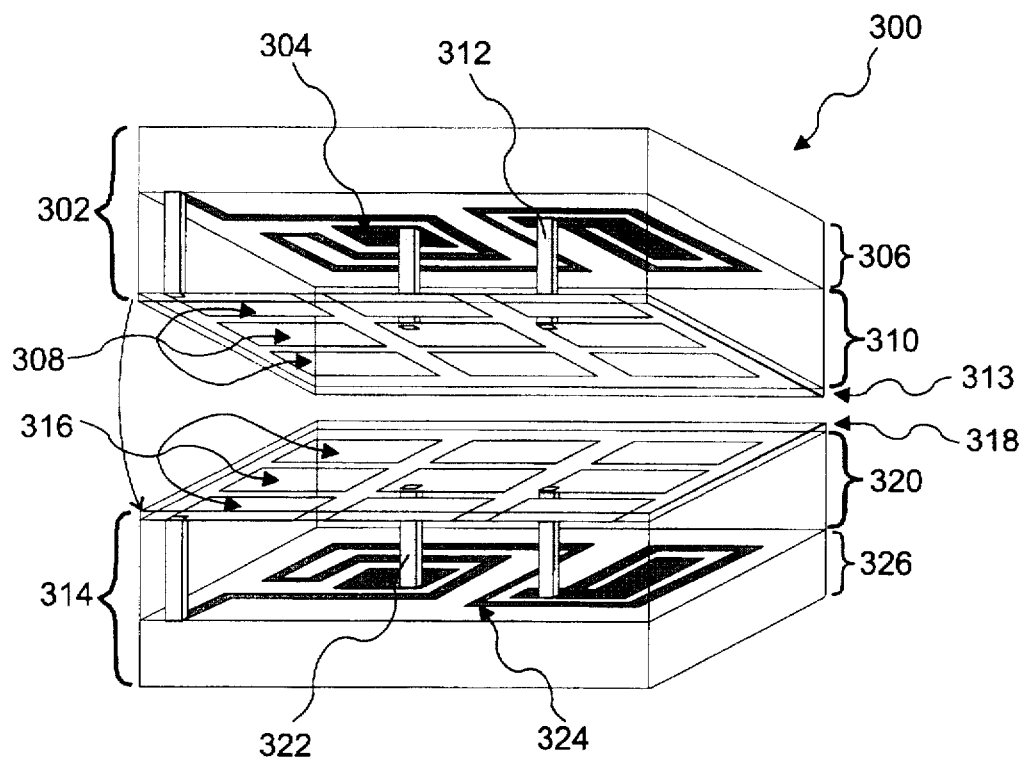
FIG. 3 is an exploded view of two chips facing each other each with contact cuts connecting a layer of metal capacitor plates to the circuit layer underneath.

However, various embodiments of the methods and apparatus described exploit inter-chip capacitive coupling to achieve unique and efficient inter-chip interconnections. FIG. 3 is an exploded view of a capacitively coupled stacked chip configuration 300. Upper chip 302 includes a circuit layer 304, which can be any circuit such as an integrated circuit, on chip substrate 306. Note that although the terms "upper" and "lower" are used, the terms are used to indicate relative positions as indicated in the figures and are not limitations on spatial orientation. A metal layer, divided into capacitor plates collectively referred to as capacitor plates 308, is added to chip 302 and separated from layers beneath, i.e. in the direction of the substrate 306, with an insulating layer 310. Capacitor plates 308 may be any metal such as aluminum, copper, alloys of aluminum and copper, or other conducting material, and insulating layer 310 may be any suitable insulating layer such as silicon dioxide. Capacitor plates 308 may be of any suitable shape and configuration. For example, capacitor plates 308 are shown as square sections but may be of any shape suitable for a capacitor plate such as rectangular or hexagonal. Additionally capacitor plates 308 may be planar or may be configured to minimize frontal area while maximizing surface area.

Each of capacitor plates 308 is connected to the circuit layer 304 underneath by a via 312 (also known as a contact cut). The insulating layer 310 separating capacitor plates 308 from lower circuit layer 304 can be thick, since the vias 312 can be larger than normal and still occupy less chip area than a normal bonding land. Vias 312 may be as small as technology allows, for example, on the order of 1–2 µm$^2$ in cross-section. In determining an adequate insulating layer 310 thickness, cross-talk between devices and capacitance between capacitor plates 308 and circuit layer 304 should be considered. The insulating layer 310 should be thick enough to provide sufficient insulation to allow signals from a source circuit on one chip to be detected by a capacitively coupled signal receiver chip. A 1–2 µm thick insulating layer 310 will provide adequate insulation; although, it will be recognized by those of ordinary skill in the art after reading this description that other thicknesses are possible.

Each of capacitor plates 308 are electrically insulated from the remaining capacitor plates 308 by providing respective separation. The amount of separation may be the same as the minimum pitch allowed between noncontacting on-chip conductors such as on-chip metal lines. Capacitor plates 308 may be as thin as practical in light of conductor deposition or other fabrication technologies. The top (i.e. away from circuit layer 304) of the metal layer of capacitor plates 308 is covered with a thin, for example 0.5 to 1 μm, relatively planar layer of insulation 313 which serves as a dielectric. Insulating layer 313 may be any dielectric material, for example, silicon dioxide.

In order to electrically connect upper chip 302 with lower chip 314, the lower chip 314 has capacitor plates 316 disposed between thin insulating layer 318 on the top surface of capacitor plates 316 and insulating layer 320. Capacitor plates 316 are disposed in a mirror image pattern of capacitor plates 308 in order to form an array of capacitors. As with upper chip 302, vias 322 connect each capacitor plate 316 to circuit layer 324 disposed on substrate 326. Arrow 326 shows that upper chip 302 and lower chip 314 are sandwiched together when capacitively coupled as shown in FIG. 4 with active surfaces facing each other.

As chips 302 and 314 are brought together, the outer insulating layers 313 and 318 on both chip 302 and 314 active surfaces prevent physical contact between capacitor plates 308 and 316. Insulating layers 313 and 318 could be omitted; however, abrasion between capacitor plates 308 and 316 could damage capacitor plates 308 and 316. The respective facing metal capacitive plates 308 and 316 form two plates of a capacitor wherever two such plates face each other, thereby forming a capacitively coupled signal path between chips 302 and 314. Chips 302 and 314 may be retained in proximate opposition using any suitable technique, for example, using mechanical clamping techniques or by adhesive bonding between edges or between faces. Additionally, faces of chips 302 and 314 may be formed with complementary textures or other complementary features to assist in maintaining one or two dimensional alignment.

Figure 4:
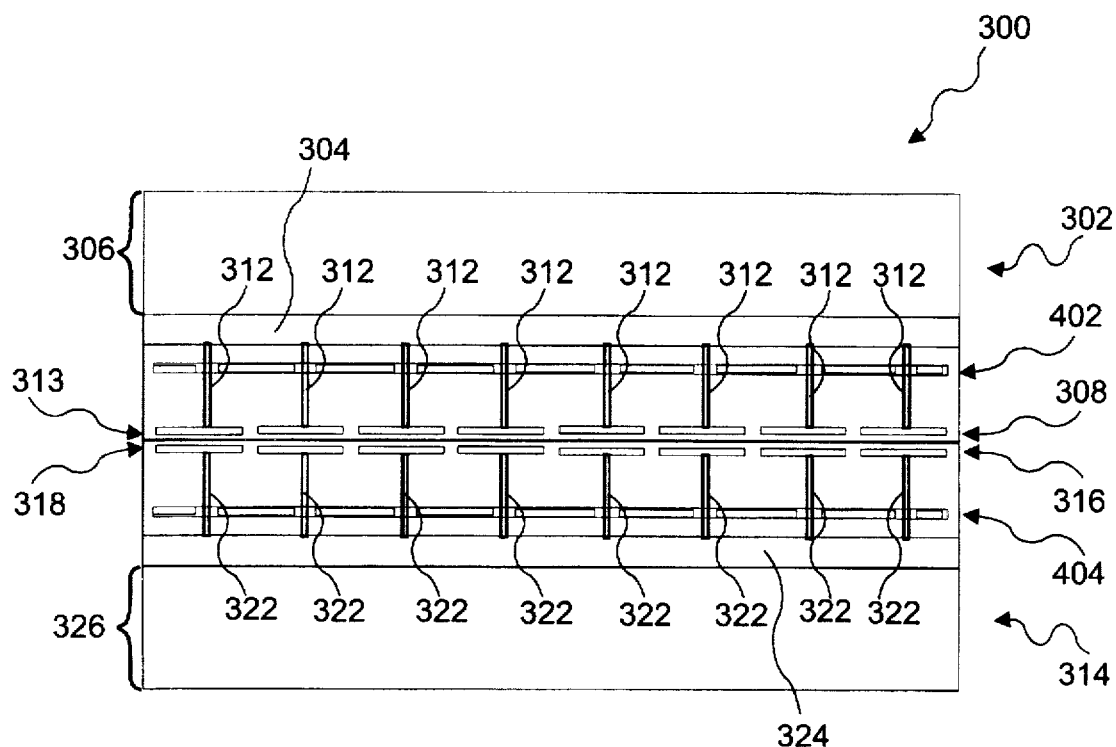
FIG. 4 is a cross-section of two chips connected together with various layers shown.

FIG. 4 also shows extra metal layers 402 and 404 between the layer of capacitive plates 308 and circuit layer 304 and between the layer of capacitive plates, collectively referred to as capacitor plates 316, and circuit layer 324, respectively. These optional metal layers 402 and 404, which are pier ed by the vias 312 and 322, respectively, are respective single electrical nodes which are grounded in order to isolate any parasitic capacitive cross-talk which might otherwise occur between capacitor plates and circuit layers beneath th m. Metal layers 402 and 404 are grounded by providing an external rounding connection(s) (not shown) to metal layers 402 and 404.

Signals may be transferred between circuit layer 304 to circuit layer 324 through vias 312 and 322 and capacitor plates 308 and 316, respectively, by using some suitable process of charging and discharging the capacitor plates. For example, a current driven by a signal from the transmitting chip 314 can be produced which can drive gates (not shown) on the receiving chip 02. For example, the receiving chip 302 may utilize Schmidt trigger sense amps. Such techniques are well known in VLSI electronics, are extensively used in dynamic random access memory (DRAM) chips, and used as well as for driving and sensing in other existing inter-chip interconnection methods.

Time varying signal properties, such as amplitude and frequency, transmitted between respective capacitors formed by opposing capacitor plates 308 and 316 may vary. Therefore, the size of capacitor plates 308 and 316 may individually vary accordingly. Since the connection between the chips 302 and 314 is capacitive, D.C. connections such as power and ground cannot be made through capacitive coupling. D.C. power and ground connections may be provided to chips 302 and 314 through external connections (not shown), for example, by extending substrates 306 and 326 and circuit layers 304 and 324 to provide conventional D.C. and ground wire access to the extended portions of circuit layers 304 and 324. In an alternative, external D.C. and ground connections may be provided through respective insulating layers 310 and 320 to circuit layers 304 and 324, respectively. In another alternative, A.C. power may be capacitively coupled between chips and conventionally rectified to provide D.C. power signals. The size of the A.C. power coupling capacitor(s) may vary depending upon the power required by the receiving circuit layer(s).

Time-varying signals can be transmitted by transmitter and receiver circuits (not shown) integrated on chips 302 and 314 by using proper translation techniques such as mathematical differentiation at the source circuit then integration at the destination circuit. For most low power signal processing functions, especially including digital logic, such signal manipulations are in common use.

It is not necessary to restrict the capacitive coupling process to two chips. If chips are placed in an offset pattern, with only a portion of each chip facing another, then chips can be cascaded to form a chain, or even a tiled surface, of interlocked chips. Distant chips are able to communicate with other chips by passing signals in a pipeline or in a systolic fashion.

Figure 5:
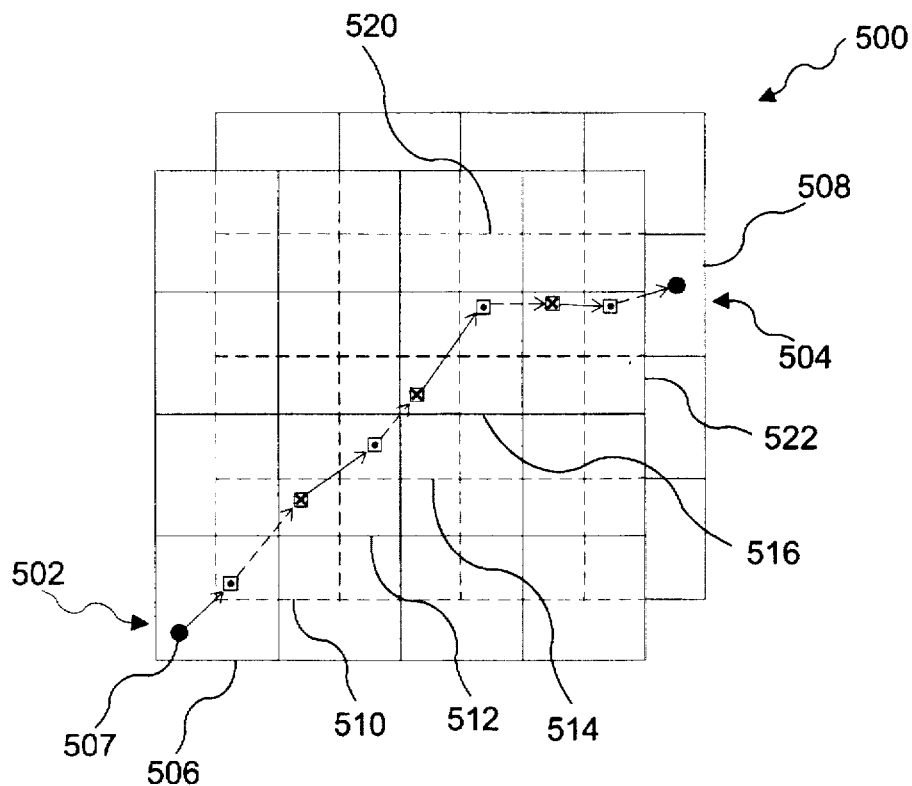
FIG. 5 illustrates the process of tiling chips with an offset, and the lower layer of tiled chips are shown with dotted lines.

A type of offset pattern structure 500 is shown in FIG. 5, along with an example of a communication path as indicated between two relatively distant chips 506 and 508. FIG. 5 illustrates an array 502 of (16) side by side or tiled upper chips capacitively coupled using opposing capacitor plates such as capacitor plates 308 and 316 (FIG. 3) to an array 504 of (16) tiled lower chips. Each chip of array 502 and 504 may be attached to and carried by respective, preferably flat substrates (not shown). Additionally, conventional wire connections to provide, for example, power and ground may be accommodated by providing access gaps between chips, and connecting the wires to terminals (not shown) on respective chips. The terminals (not shown) may be provided by at most only partially covering each chip with a capacitive interconnection layer to reserve a portion of each chip for conventional wire connections.

In operation, a signal is transmitted from signal source 507 on chip 506 and travels to chip 510 in tiled array 504 along the indicated path and then travels to chip 512 in tiled array 502 using a capacitive couple. The signal continues traveling or "hopping" from chip 512 to chip 514, from chip 514 to chip 516, from chip 516 to chip 520, from chip 520 to chip 522, and from chip 522 to chip 508 using respective capacitive couples and intrachip propagation. It is also not necessary that two facing chips have the same semiconductor technology. For example one can be a silicon chip, the other a Gallium Arsenide chip, or one can be a 3.3 volt power supply CMOS chip and the other a 5 volt power supply Bipolar transistor chip.

Figure 6:
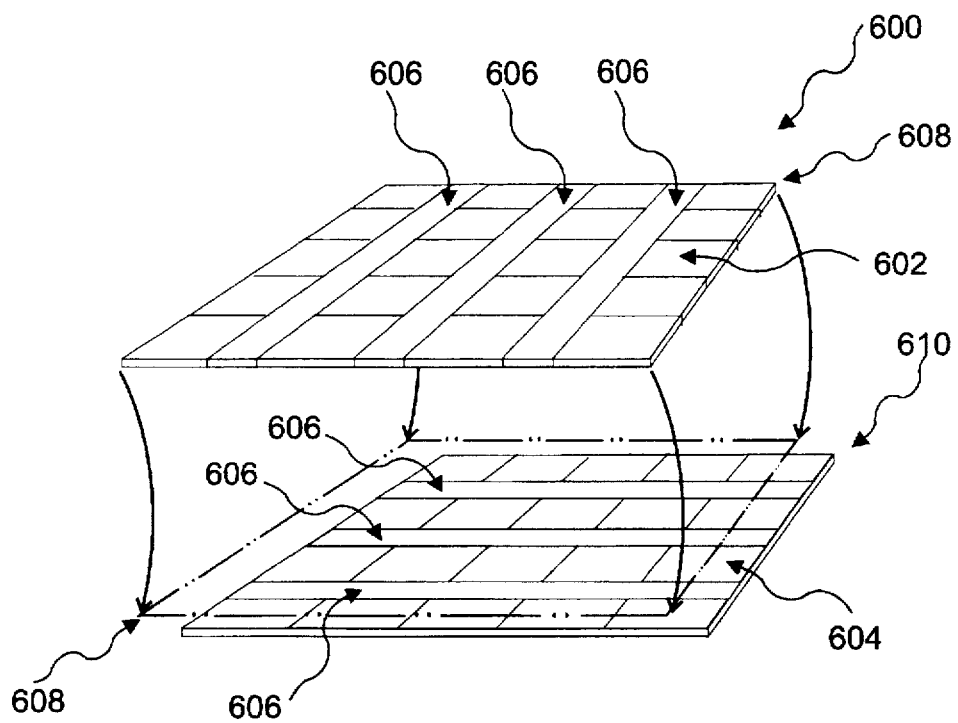
FIG. 6 is an exploded view of two arrays of chips arranged as two respective tiled surfaces with alternating rows of long, thin chips used as communication paths across the arrays.

FIG. 6 illustrates how a large array 600 of chips can be organized so that in addition to ordinary chips such as chips 602 and 604, special long chips 606 can be included, in alternating rows on one tiled array 608 and in alternating columns on the other tiled array 610. In three "hops" communication can occur between any two chosen chips across a very large array 600. Communication paths can be mapped as in FIG. 5 using the long chips 606 to propagate signals up to the perimeter of array 600.

The methods and structures described herein provide potentially much greater interconnect densities than existing methods because of small capacitor plate sizes since capacitor plate sizes may be reduced while maintaining a given capacitance if the capacitor plates are placed in closer proximity. Capacitor plate sizes can be as small as chip surface proximity placing techniques allow. Also, because the capacitor plate interconnect layer can reside above the circuit layer, the interconnect layer doesn't compete for area on the chip. Implementing the structures in manufacture is easier than conventional methods, since the inter-chip capacitive interconnect only requires that chips be brought together. The chips don't have to be bonded to each other.

In manufacture, it is possible to measure the proper alignment of the chips being placed together, since the capacitance will peak when the chips are in their best alignment. Capacitance peak detection can be used to align the chips as they are being mated in a packaging process by having test pads on each chip connected to I/O pads. External circuitry can measure the capacitance as it varies with chip alignment.

EXAMPLE

In terms of the orders of magnitude of capacitive coupling interconnections, consider a case where each capacitor plate 308 and 316 is about 300 microns on a side and where the separation between plates 308 and 316 is about 50 microns. It is an extremely conservative estimate that two chips placed together, with adequate insulating layers between the two metal surfaces, can be brought to within 50 microns of each other, even with surface unevenness. Now suppose that as a conservative estimate, there is an air gap between the two plates 308 and 316 and no interposed dielectric. Using the permittivity of free space $\epsilon_0$, the capacitance C of each capacitor will be:

$$C = (Area \times \epsilon_0) \div separation$$

$$C = ((300 \times 10^{-6})^2 \text{ meters}^2 \times 8.85 \times 10^{-12} \text{ farads/meter}) \div (50 \times 10^{-6} \text{ meters}) = 15.93 \text{ femtofarads}$$

While this is a small capacitance, it is of the same order of magnitude as a single gate capacitance in present CMOS technology. Therefore, this capacitance can be used to charge or discharge a signal receiving plate 308 and 316 with a signal transmitted by a signal transmitting plate 316 or 308, respectively. Capacitance values may vary, for example, from approximately 5 femtofarads or less, according to, for example, the ability of level sensing circuits to sense transmitted signals. If necessary, the same type of level sensing circuit as used in DRAMs can be employed. Note that, while the capacitor plate 308 and 316 areas are large, they do not occupy area otherwise used by the respective circuit layers 304 and 324 underneath. Only the relatively small area on circuit layers 304 and 324 used to contact with vias 312 and 322, respectively, is allocated to inter-chip interconnection. Because the plates 308 and 316 are only tied to the underlying circuit layers 304 and 324, respectively, by vias, alignment can be relaxed. Therefore, adding an extra interconnect layer is not a major limitation from an alignment stand point.

The number of such capacitor interconnects that can be placed on a chip is a function of chip area as compared to the area per capacitor plate. A large chip might have an area of 1 cm.×1 cm.=$10^{-4}$ meters$^2$. Each plate occupies 3 ×$10^{-4}$× 3×$10^{-4}$=9×$10^{-8}$ meters$^2$. Therefore roughly 1,000 capacitor plates can be placed on a chip. If the area between tiled capacitor plates can be reduced, the number of capacitor plates can be increased in inverse proportion. Just as significantly, if the gap between opposing capacitor plates can be filled with a dielectric such as $SiO_2$, the number of capacitive coupling contacts having the same capacitance as an air gap capacitor, can be increased, for example, roughly quadrupled due to the superior permittivity of $SiO_2$ over air. Since the above estimates are rough, the above may be taken as only an order of magnitude value. Note that this technique can allow two 1 cm$^2$ chips separated by an air gap connected with up to 1,000 signal lines. However, a 50 μm gap between chips is an extremely conservative estimate. By reducing the gap between chips to a few microns and filling the gap with a dielectric material such as insulating layers 313 and 318, the number of interconnections can be increased by two or more orders of magnitude to 100,000 or more individual inter-chip electrical connections. Note that the process of placing and precisely aligning two chips face to face within a few microns of each other may be generally the same as the process of aligning a mask during chip manufacture. This process of alignment is well understood and can be accomplished with current technology.

OTHER EMBODIMENTS

The above description primarily discusses pairs of chips capacitively coupled in facial opposition. However, other processes of interconnecting multiple chips using capacitive coupling are contemplated. For example, it is also possible to place chips side-by-side and face down onto a passive wafer surface. The silicon wafer serves as a circuit board and interconnects the chips by placing capacitive plates on the wafer facing similar plates on the two chips. The plates on the wafer are then connected to each other with conduction paths, thereby creating a capacitive coupling. Such an embodiment is illustrated in FIG. 7.

Figure 7:
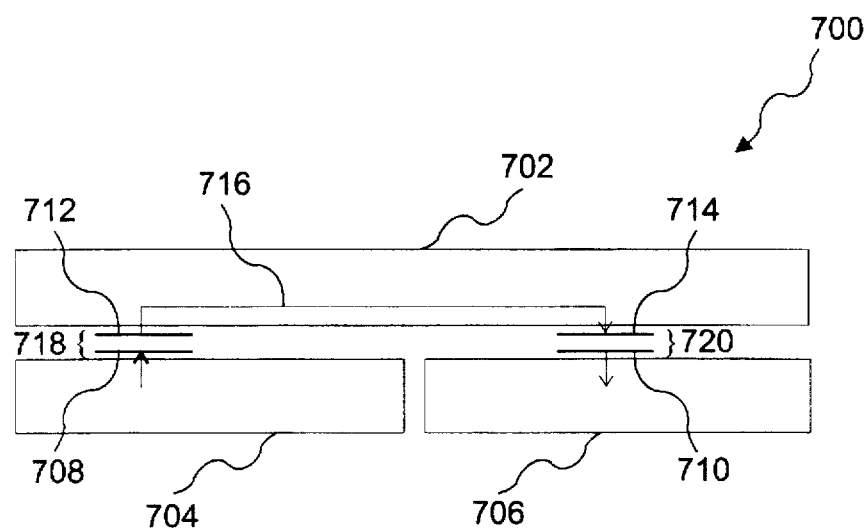
FIG. 7 is a schematic showing a side view of multiple chips positioned side by side in a capacitive coupling relationship with a passive wafer.

In FIG. 7, silicon wafer 702 of inter-chip communication assembly 700 provides an intermediate communication path between side-by-side positioned chips 704 and 706. Wafer 702 also serves as a multi-chip holding platform. Chips 704 and 706 include illustrative capacitor plates 708 and 710 coupled by vias (not shown) to circuit layers underneath (not shown) generally as described in conjunction with chips 302 and 314 (FIG. 3). Capacitances electrically linking chips 704 and 706 to wafer 708 are formed by positioning capacitor plates 708 and 710 in opposition to illustrative capacitor plates 712 and 714, respectively, on wafer 702. Capacitor plates 712 and 714 are physically connected by conduction path 716 which may be a wire line etched into the surface of wafer 702 or any other single or multi-layered electrically conductive path. Also as discussed, the gaps between chip capacitor plates and wafer capacitor plates may be filled with a dielectric to allow decreases in the capacitor plate sizes. Wafer 702 may be silicon as discussed or may be of any other material capable of supporting a capacitor plate, serving as a multi-chip holding platform, and having conductive paths. Additionally, wafer 702 may hold as many chips as wafer surface area and maximum conduction path density allows.

In operation, for example, a signal, generated on chip 704, is transferred from chip 704 to chip 706 as indicated by the arrows going into capacitor plates 708 and 714 and coming out of capacitor plate 710. With the interconnection of wire line 716, charge is distributed across capacitors 718 and 720. The charge on capacitor plate 710 is detected by a detection circuit on chip 706. In this way the signal generated by chip 704 is transmitted to and received by chip 706 through capacitive coupling interconnections and intermediate wafer 702 interconnection.

Of course, high density interconnectability can be achieved by adding additional capacitor plates, tiled in a high density configuration on chips 704 and 706 in opposition to mirror image capacitor plates on wafer 702 with high density single or multi-layered wafer conduction paths.

Figure 8:
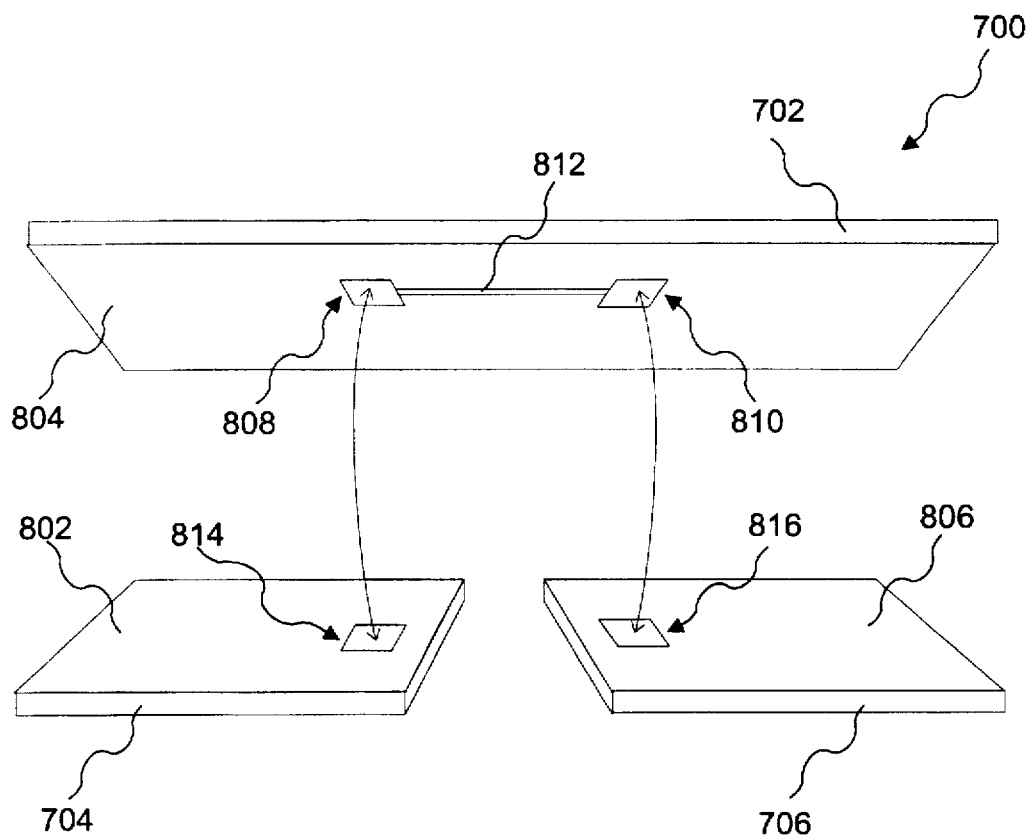
FIG. 8 is an exploded view of two chips and an inter-chip communication board showing the placement of capacitor plates and the resulting communication path.

FIG. 8 illustrates how one embodiment of such a high density arrangement would appear on the chip 704 and 706 surface faces with the chips 704 and 706 separated in order to view the opposing surfaces 802 and 804 and opposing surfaces 806 and 804. Note that on the chip holding wafer 702 only passive capacitor plates 808 and 810 and linking wires 812 are disposed on the surface 804. As long as the dimensions of these passive plates 808 and 810 and wires 812 are kept small, on the same size order as conventional on-chip wiring, the driving and receiving circuits (not shown) on the two active chips 802 and 806 need not be any larger than driving and receiving circuits used with conventional interconnections. For example, DRAM memory cell driver and receiving circuits or equivalents may be used.

It is possible to run wires such as wires 812 over longer distances than just between pairs of side-by-side chips. The passive surface 804, which carries the inter-chip connection wires 812 and capacitor plate arrays 808 and 810 to connect chips 802 and 806, need not be made of silicon. Other materials such as glass or plastics may be used and may prove more economical. The only requirement is that the chosen material should be as flat as the chips facing it, and it should be possible to print capacitor plate arrays 808 and 810 with the same level of detail as capacitor plate arrays 814 and 816 on the chips 704 and 706, respectively. Differences in thermal expansion rates for the different materials can be accommodated by designing individual capacitor plates with enough spacing and size to accept some misalignment and movement with thermal expansion during operation.

Notice that the overall length and width dimensions of capacitor plates 814 and 816 vary from the overall length and width dimensions of chips 704 and 706. Layers of capacitor plates may have any dimensions and may independently vary from overall chip dimensions as shown in FIG. 8. Also, although the layers of capacitor plates 814 and 816 are shown in an overall square configuration, the configuration may vary. The concept of independently varying capacitor plate layer configurations also applies to other chip-to-chip interconnection schemes such as those shown in FIGS. 3-7. Furthermore, multiple groups of layers of capacitors may be dispersed as needed over a respective substrate. In this manner, the number of chip-to-chip interconnections can be tailored to meet specific circuit requirements.

While the invention has been described with respect to the embodiments and variations set forth above, these embodiments and variations are illustrative and the invention is not to be considered limited in scope to these embodiments and variations. For example, the materials, dimensions, and geometric configurations may be varied. Furthermore, chips may use electro-magnetic coupling devices in conjunction with conventional interconnection techniques. For example, capacitor plate layers may overlie only selected portions of a chip which allows for conventional wire connections to remaining portions of the chip. Additionally, although capacitive coupling has been described, inductive coupling or a combination of inductive and capacitive coupling may be used to provide inter-chip communication of time-varying signals. Accordingly, various other embodiments and modifications and improvements not described herein may be within the spirit and scope of the present invention, as defined by the following claims.

What is claimed is:

1. An assembly comprising:
    a first chip having a first substrate and a first circuit disposed on a face of the first substrate, the first chip further having a first means for coupling disposed over the face of the first substrate and coupled to the first circuit; and
    a second chip, disposed in a face-to-face spatial relationship to the first chip, the second chip having a second substrate and a second circuit disposed on a face of the substrate, the second chip further having a second means for coupling disposed over the face of the second substrate and coupled to the second circuit, wherein the first and second means for coupling provide at least one electromagnetic path between the first and second chips for time-varying signals.

2. The assembly as in claim 1 wherein the first and second means for coupling each comprise respective pluralities of conductors disposed in opposition to form a plurality of capacitors.

3. The assembly as in claim 2 wherein the conductors are respective metal plates.

4. The assembly as in claim 1 wherein the first and second circuits are integrated circuits.

5. The assembly as in claim 1 further comprising a third chip, disposed in a face-to-face spatial relationship to the first chip, the third chip having a third substrate and a third circuit disposed on a face of the third substrate, the third chip further having a third means for coupling disposed over the face of the third substrate and coupled to the third circuit, wherein the first and third means for coupling provide at least one electromagnetic path between the first and third chips for time-varying signals.

6. The assembly as in claim 1 further comprising:
    a first dielectric layer disposed over the first means for coupling; and
    a second dielectric layer disposed over the second means for coupling.

7. The assembly as in claim 1 further comprising:
    a first plurality of vias coupled between the first circuit and the first means for coupling; and a second plurality of vias coupled between the second circuit and the second means for coupling.

8. An assembly comprising:
    a first conducting plate;
    a first substrate having a circuit disposed on a face thereof between the first substrate and the first conducting plate and coupled to the first conducting plate;
    a second conducting plate capacitively coupled to the first conducting plate; and
    a second substrate having a circuit disposed on a face thereof between the second substrate and the second conducting plate and coupled to the second conducting plate;
    wherein the first and second substrates are spatially oriented in a face-to-face disposition.

11

9. The assembly as in claim 8 wherein the first and second conducting plates are respective flat, metal plates.

10. The assembly as in claim 8 wherein the second substrate circuit comprises an interconnect communication network.

11. The assembly as in claim 8 wherein the second substrate circuit is an active, integrated circuit.

12. The assembly as in claim 8 further comprising:
a first insulating layer disposed over the first conducting plate; and
a second insulating layer disposed over the second conducting plate.

13. The assembly as in claim 8 wherein a gap exists between the first and second conducting plates.

14. The assembly as in claim 13 wherein the gap is filled with air.

15. The assembly as in claim 13 wherein the gap is filled with a dielectric material.

16. The assembly as in claim 15 wherein the dielectric material includes silicon dioxide.

17. The assembly as in claim 8 further comprising:
a plurality of conducting plates capacitively coupled to the first conducting plate;
a plurality of substrates each having a circuit, each circuit being disposed between one of the plurality of substrates and one of the plurality of conducting plates and coupled to the respective overlying conducting plate;
wherein the first substrate and the plurality of substrates are spatially oriented in a face-to-face disposition.

18. The assembly as in claim 8 further comprising:
a first insulation layer separating the first conducting plate from the first substrate circuit;
a first via disposed through the first insulation layer and connected to the first substrate circuit and the first conducting plate;
a second insulation layer separating the second conducting plate from the second substrate circuit; and
a second via disposed through the second insulation layer and connected to the second substrate circuit and the second conducting plate.

19. The assembly as in claim 18 further comprising:
a first grounded metal layer having an opening for the first via and disposed within the first insulation layer.

20. The assembly as in claim 18 further comprising:
a second grounded metal layer having an opening for the second via and disposed within the second insulation layer.

21. The assembly as in claim 8 further comprising:
a third, conducting plate disposed over the second substrate face and coupled to the second conducting plate;
a fourth conducting plate capacitively coupled to the third conducting plate; and
a third substrate having a circuit on a face of the third substrate, the third substrate circuit being disposed between the third substrate and the fourth conducting plate and coupled to the fourth conducting plate.

22. The assembly as in claim 8 wherein the assembly is packaged as a multi-chip module.

23. A chip interconnection assembly comprising:
a first chip having a first substrate layer, a first circuit on a face of the first substrate layer, a first insulation layer disposed over the face of the first substrate layer, a plurality of first conductive plates disposed on the first insulation layer, a plurality of first vias disposed through the first insulation layer and respectively coupling the first conductive plates to the first circuit, and a second insulation layer disposed over the first conductive plates; and
a second chip having a second substrate layer, a second circuit on a face of the second substrate layer, a third insulation layer disposed over the face of the second substrate layer, a plurality of second conductive plates disposed on the third insulation layer, a plurality of second vias disposed through the third insulation layer and respectively coupling the second conductive plates to the second circuit, and a fourth insulation layer disposed over the second conductive plates;
wherein the first chip is disposed in a face-to-face spatial orientation relative to the second chip and at least one of the first conductive plates is juxtaposed with at least one of the second conductive plates to form a capacitor.

24. The chip interconnection assembly as in claim 23 wherein:
the second chip is a passive chip carrier, and the second chip further comprises a plurality of third conductive plates disposed on the third insulation layer, a plurality of third vias disposed through the third insulation layer and respectively coupling the third conductive plates to the second circuit; and
the second circuit includes a plurality of communication paths, each one of the communication paths connecting one of the second conductive plates to one of the third conductive plates;
the chip interconnection assembly further comprising:
a third chip having a third substrate layer, a third circuit on a face of the third substrate layer, a fifth insulation layer disposed over the face of the third substrate layer, a plurality of fourth conductive plates disposed on the fifth insulation layer in an approximate mirror image of the third conductive plates, a plurality of fourth vias disposed through the fifth insulation layer and respectively coupling the fourth conductive plates to the third circuit, and a sixth insulation layer disposed over the fourth conductive plates;
wherein the third chip is disposed in a face-to-face spatial orientation relative to the second chip and at least one of the third conductive plates is juxtaposed with at least one of the fourth conductive plates to form a capacitor.

25. The chip interconnection assembly as in claim 23 wherein the second conductive plates are disposed in an approximate mirror image of the first conductive plates.

26. The chip interconnection assembly as in claim 23 wherein the second circuit layer includes active circuit devices including signal receiving and transmitting circuits.

27. The chip interconnection assembly as in claim 23 wherein the first conductive plates are disposed in a tiled array, and the second conductive plates are disposed in a tiled array.

28. A multi-chip interconnection assembly comprising:
a plurality of first chips disposed in a first tiled array, the first chips each having a first substrate layer, a first circuit on a face of the first substrate layer, a plurality of first capacitor plates disposed over and coupled to the first circuit layer, and a first insulation layer disposed over the first capacitor plates; and
a plurality of second chips disposed in a second tiled array, the second chips each having a second substrate layer, a second circuit on a face of the second substrate layer, a plurality of second capacitor plates disposed over and coupled to the second circuit layer, and a second insulation layer disposed over the second capacitor plates;

wherein the first chips are spatially oriented in an offset face to-face juxtaposition with the second chips so that certain capacitor plates of the first chips and certain capacitor plates of the second chips form capacitors for capacitively coupling each of the first chips to at least one of the second chips.

29. The multi-chip interconnection assembly as in claim 28 wherein:

the first tiled array includes a set of first columns each having a plurality of chips and a set of second columns alternately interposed between respective first columns and primarily dedicated to communication paths, the first and second columns being of substantially equal length; and the second tiled array includes a set of first rows each having a plurality of chips and a set of second rows alternately interposed between respective first rows and primarily dedicated to communication paths, the first and second rows being of substantially equal length.

30. A method of interconnecting a plurality of chips utilizing electromagnetic signal communication paths, each chip having a circuit layer disposed on a face of a substrate and an electromagnetic coupling device element coupled to and disposed over the circuit layer, and each chip being oriented with respect to at least one other chip to bring the electromagnetic coupling device elements of the oriented chips into juxtaposition, the method comprising the steps of:

generating a time-varying signal in a circuit of a first chip of the plurality of chips; and coupling the time-varying signal to a circuit of a second chip of the plurality of chips, the second chip being oriented with the first chip, through an electromagnetic signal communication path formed by the juxtaposition of the electromagnetic coupling device elements of the first and second chips.

31. The method of claim 30 wherein each of the electromagnetic coupling device elements of the first and second chips comprises a conducting plate, the conducting plates of the first and second chips forming a capacitor.

32. The method of claim 31 further comprising the steps of:

measuring capacitance between the conducting plates of the first and second chips; and aligning the substrates of the first and second chips so that the measured capacitance is maximized.

33. The method of claim 30 wherein the electromagnetic coupling device element of the first chip comprises a first conducting plate, the electromagnetic coupling device element of the second chip comprises a second conducting plate; and the electromagnetic signal communication path between the first and second chips comprises a first via coupled between the first conducting plate and the circuit layer of the first chip and a second via coupled between the second conducting plate and the circuit layer of the second chip, the first and second conducting plates being oriented to form a capacitor.

34. The method of claim 30 wherein the coupling step comprises:

transmitting the time-varying signal from the circuit layer of the first chip to the electromagnetic coupling device element of the first chip;

energizing the electromagnetic coupling device element of the first chip with the time-varying signal;

responsively energizing the electromagnetic coupling device element of the second chip with the time-varying signal; and receiving the time-varying signal from the electromagnetic coupling device element of the second chip with the circuit layer of the second chip.

35. The method of claim 30 wherein a first group of the chips is arranged in a first tiled array and a second group of the chips is arranged in a second tiled array, the first chip being in one of the first and second tiled arrays and each of the chips in the first tiled array being oriented with respect to at least one of the chips in the second tiled array to form a plurality of electromagnetic signal communications paths between the first tiled array and the second tiled array, the method further comprising:

alternately transferring the time-varying signal between chips in the first tiled array and chips in the second tiled array using the electromagnetic signal communication paths; and receiving the time-varying signal with the circuit layer of a third chip of the plurality of chips the third chip being in one of the first and second tiled arrays.

36. The method of claim 35 wherein the first chip and the third chip are disposed in the first array and the second chip is disposed in the second array, and the alternately transferring step comprises the steps of:

transferring the time-varying signal from the first chip to the second chip in the second array;

transferring the time-varying signal from the second chip to a fourth chip in the first array;

transferring the time-varying signal from the fourth chip to a fifth chip in the second array; and transferring the time-varying signal from the fifth chip to the third chip.

37. The method as in claim 36 wherein the step of transferring the time varying signal from the first chip to the second chip comprises the steps of:

energizing a first electromagnetic device coupling element of the first chip with the time-varying signal; and responsively energizing a second electromagnetic device coupling element of the second chip with the time-varying signal through electromagnetic coupling with the first electromagnetic device coupling element;

wherein the step of transferring the time-varying signal from the second chip to the fourth chip comprises the steps of:

coupling the time-varying signal from the second electromagnetic device coupling element of the second chip to a third electromagnetic device coupling element of the second chip;

energizing the third electromagnetic device coupling element of the second chip with the time-varying signal; and responsively energizing a fourth electromagnetic device coupling element of the fourth chip with the time-varying signal through electromagnetic coupling with the third electromagnetic device coupling element;

wherein the step of transferring the time-varying signal from the fourth chip to the fifth chip comprises the steps of:

coupling the time-varying signal from the fourth electromagnetic device coupling element of the fourth chip to a fifth electromagnetic device coupling element of the fourth chip;

energizing the fifth electromagnetic device coupling element of the fourth chip with the time-varying signal; and responsively energizing a sixth electromagnetic device coupling element of the fifth chip with the time-varying signal through electromagnetic coupling with the fifth electromagnetic device coupling element; and wherein the step of transferring the time-varying signal from the fifth chip to the third chip comprises the steps of:

coupling the time-varying signal from the sixth electromagnetic device coupling element of the fifth chip to a seventh electromagnetic device coupling element of the fifth chip;

energizing the seventh electromagnetic device coupling element of the fifth chip with the time-varying signal; and responsively energizing an eighth electromagnetic device coupling element of the third chip with the time-varying signal through electromagnetic coupling with the seventh electromagnetic device coupling element.

* * * * *